United States Patent
Mair et al.

(10) Patent No.: US 7,961,546 B2
(45) Date of Patent: Jun. 14, 2011

(54) MEMORY POWER MANAGEMENT SYSTEMS AND METHODS

(75) Inventors: Hugh T. Mair, Fairview, TX (US); Robert L. Pitts, Dallas, TX (US); Alice Wang, Allen, TX (US); Sumanth K. Gururjarao, Dallas, TX (US); Ramaprasath Vilangudipitchai, Plano, TX (US); Gordon Gammie, Plano, TX (US); Uming Ko, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 439 days.

(21) Appl. No.: 12/258,747

(22) Filed: Oct. 27, 2008

(65) Prior Publication Data

US 2010/0103760 A1    Apr. 29, 2010

Related U.S. Application Data

(60) Provisional application No. 61/026,306, filed on Feb. 5, 2008.

(51) Int. Cl.
*G11C 5/14* (2006.01)
(52) U.S. Cl. ......... 365/227; 365/226; 365/228; 365/229
(58) Field of Classification Search .................. 365/226, 365/227, 228, 229
See application file for complete search history.

(56) References Cited

U.S. PATENT DOCUMENTS

| 5,367,487 | A | * | 11/1994 | Yoshida | 365/189.09 |
|---|---|---|---|---|---|
| 5,703,825 | A | * | 12/1997 | Akiba et al. | 365/229 |
| 5,747,974 | A | * | 5/1998 | Jeon | 323/269 |
| 5,844,853 | A | * | 12/1998 | Kitsukawa et al. | 365/226 |
| 6,560,157 | B2 | * | 5/2003 | Sugita et al. | 365/226 |
| 6,574,150 | B2 | * | 6/2003 | Suyama et al. | 365/189.05 |
| 6,864,708 | B2 | | 3/2005 | Takahashi et al. | |
| 7,729,194 | B2 | * | 6/2010 | Zanders | 365/229 |
| 2005/0194592 | A1 | | 9/2005 | Mair et al. | |
| 2008/0137444 | A1 | | 6/2008 | Mair et al. | |

* cited by examiner

*Primary Examiner* — VanThu Nguyen
(74) *Attorney, Agent, or Firm* — Ronald O. Neerings; Wade James Brady, III; Frederick J. Telecky, Jr.

(57) ABSTRACT

Memory power management systems and methods are provided. One embodiment of the present invention includes a memory power management system. The system comprises a first low dropout (LDO) regulator that provides an active operating voltage that is derived from a first supply voltage to power a memory array during an active mode. The system further comprises a second LDO regulator that provides a minimum memory retention voltage that is derived from a second supply voltage to power the memory array in a standby mode, wherein the second supply voltage also powers at least one peripheral circuit for reading from and/or writing to the memory array.

15 Claims, 4 Drawing Sheets

MEMORY POWER MANAGEMENT SYSTEMS AND METHODS

This amendment claims priority under 35 USC §119(e)(1) of provisional application No. 61/026,306, filed Feb. 5, 2008.

TECHNICAL FIELD

This invention relates to electronic circuits, and more specifically to memory power management systems and methods.

BACKGROUND

Static random access memory (SRAM) is a type of RAM that uses transistor driven memory cells to latch bits of data for memory storage and is used in a large variety of consumer electronics, such as computers and cellular telephones. Memory cells in an SRAM circuit are typically arranged in an array, such that the SRAM includes individually addressable rows and columns to which data can be written and from which data can be read. The individually addressable rows and columns are controlled by peripheral circuitry that receives decoded signals from associated logic circuitry that correspond to memory locations, which could be generated from a processor, such that the peripheral circuitry determines which of the memory cells in the array are accessed for read and write operations at any given time. While data is being transferred to and from an SRAM circuit, the SRAM is considered to be in an active mode, such that all of the memory cells in the array are receiving power and are capable of freely allowing data transfer to and from the memory cells.

The market for consumer electronics, however, is constantly improving. There is an increasing demand for smaller circuit packages that operate at increased speeds and consume less power for the purpose of conserving battery-life, such as in wireless communication applications. To achieve greater speeds, a typical SRAM may operate at an increased voltage potential and/or employ transistors with reduced gate widths (e.g., 45 nm). However, prolonged increased voltage operation creates an increased demand on the power supply, thus shortening battery life. Accordingly, a typical SRAM may be configured to lower the operating voltage during less memory intensive operation. However, as SRAM transistor gate-oxide sizes are designed to be smaller, the minimum threshold voltage of the memory array required for read/write operations may be higher than a desired operating voltage of the peripheral circuitry and the associated logic circuitry during less memory intensive operation.

SUMMARY

In one aspect of the invention, a memory power management system is provided. The system comprises a first low dropout (LDO) regulator that provides an active operating voltage that is derived from a first supply voltage to power a memory array during an active mode. The system further comprises a second LDO regulator that provides a minimum memory retention voltage that is derived from a second supply voltage to power the memory array in a standby mode, wherein the second supply voltage also powers at least one peripheral circuit for reading from and/or writing to the memory array.

In another aspect of the invention, a method is provided for managing power of a memory array. The method comprises providing an active operating voltage to provide power to the memory array and selectably coupling a respective selectably coupleable diode to each of a plurality of memory blocks of the memory array to provide a minimum memory retention voltage to power each of the plurality of memory blocks. The method further comprises selectably decoupling a respective selectably coupleable diode from a selected memory block of the memory array to provide an active operating voltage to power the selected memory block and reading from or writing to the selected memory.

In yet another aspect of the invention, an integrated circuit (IC) is provided that comprises a memory system having a memory array and one or more peripheral circuits for reading and/or writing to the memory array. The IC further comprises a power management system that includes a first LDO regulator that provides an active operating voltage that is derived from a first supply voltage to power the memory array during an active mode and a second LDO regulator that provides a minimum memory retention voltage that is derived from a second supply voltage to power the memory array in a standby mode, wherein the second supply voltage is at a minimum peripheral voltage for powering the one or more peripheral circuits for reading and/or writing to the memory array.

DETAILED DESCRIPTION

The present invention relates to electronic circuits, and more specifically to memory power management systems and methods. In an active mode, the power management system outputs an active operating voltage to power the memory array during an active mode. An active mode is mode in which one or more peripheral circuits can read from or write to memory cells of the memory array. The active operating voltage is a voltage that is substantially high enough to provide for reliable reading and/or writing to the memory cells. In a standby mode of operation, the power management system outputs a minimum memory retention voltage, which can be a voltage that is less than the active operating voltage for read/write operations of the memory array but is sufficient for retaining data logic states in the memory cells.

Figure 1:
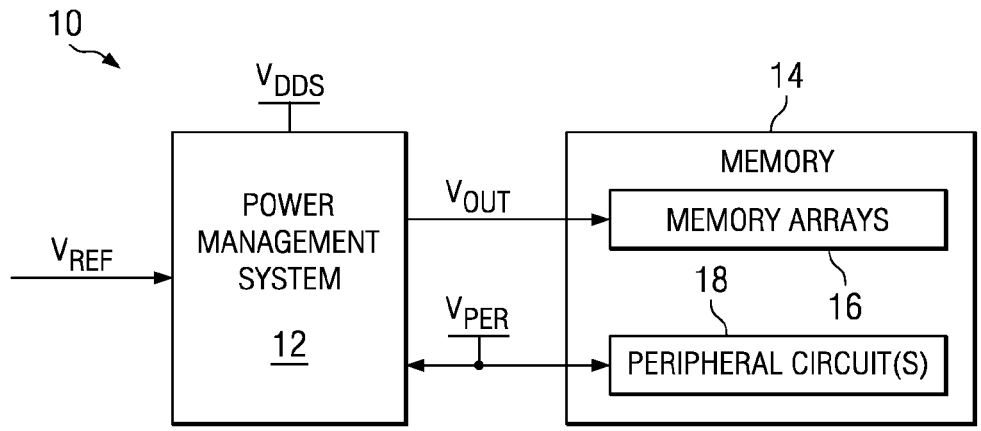
FIG. 1 illustrates a block diagram of a portion of an integrated circuit chip in accordance with an aspect of the invention.

FIG. 1 illustrates a block diagram of a portion of an integrated circuit chip 10 in accordance with an aspect of the invention. The integrated circuit chip 10 includes a power management system 12 and a memory system 14. The power management system 12 and memory system 14 can be part of a larger system that includes a controller, I/O circuits and other logic to provide a system on chip solution (e.g., for handheld and/or portable devices). In the present example, the memory system 14 includes one or more memory arrays 16 comprised of rows and columns of memory cells and one or more peripheral circuits 18 configured to read and/or write logic states to the memory cells of the one or more arrays 16. The power management system 12 is configured to provide an active operating voltage during an active mode and a minimum memory retention voltage in a standby mode for providing power to the one or more memory arrays 16. The one or more peripheral circuits 18 can include logic configured to interpret and decode signals for the activation of memory rows and memory columns in the one or more memory arrays 16 for read/write operations. As an example, the decode signals can be generated by associated logic circuitry (not shown) that can provide an interface between one or more processors and the memory system 14.

The power management system 12 receives positive supply voltage $V_{DDS}$, a reference voltage $V_{REF}$, and a peripheral supply voltage $V_{PER}$. As an example, the positive supply voltage $V_{DDS}$ can be an existing on-chip DC voltage, such that the positive supply voltage $V_{DDS}$ can provide a substantially fixed predetermined voltage to other components on the integrated circuit (IC) that includes the power management system 12 and the memory system 14. For example, the positive supply voltage $V_{DDS}$ can be an input/output (I/O) voltage of approximately 1.8V that provides power to an I/O component of the IC 10 on which the power management system 12 and memory system 14 is implemented. The power management system 12 provides a memory array supply voltage $V_{OUT}$ that varies based on the reference voltage $V_{REF}$ and a selection between an active mode and a standby mode of operation. The reference voltage $V_{REF}$ can be a substantially fixed DC voltage that is set for a minimum threshold for read/write operations of the one or more memory arrays 16 in an active mode of operation.

For example, for small geometry transistors having a gate size of approximately 45 nm, a minimum threshold voltage for the one or more memory arrays 16 for read/write operations can be approximately 1.2V. For example, the reference voltage $V_{REF}$ can be a voltage that is generated, for example, from a band-gap voltage source. The power management system 12 can include logic and/or control for selecting between an active mode and a standby mode of operation, or the logic can reside at a separate logic and/or control residing elsewhere on the IC 10. The power mode determines whether an active operating voltage or a minimum memory retention voltage is provided for powering the memory array. The peripheral supply voltage $V_{OUT}$ also provides power to the one or more peripheral circuits 18 of the memory system 14.

Figure 6:
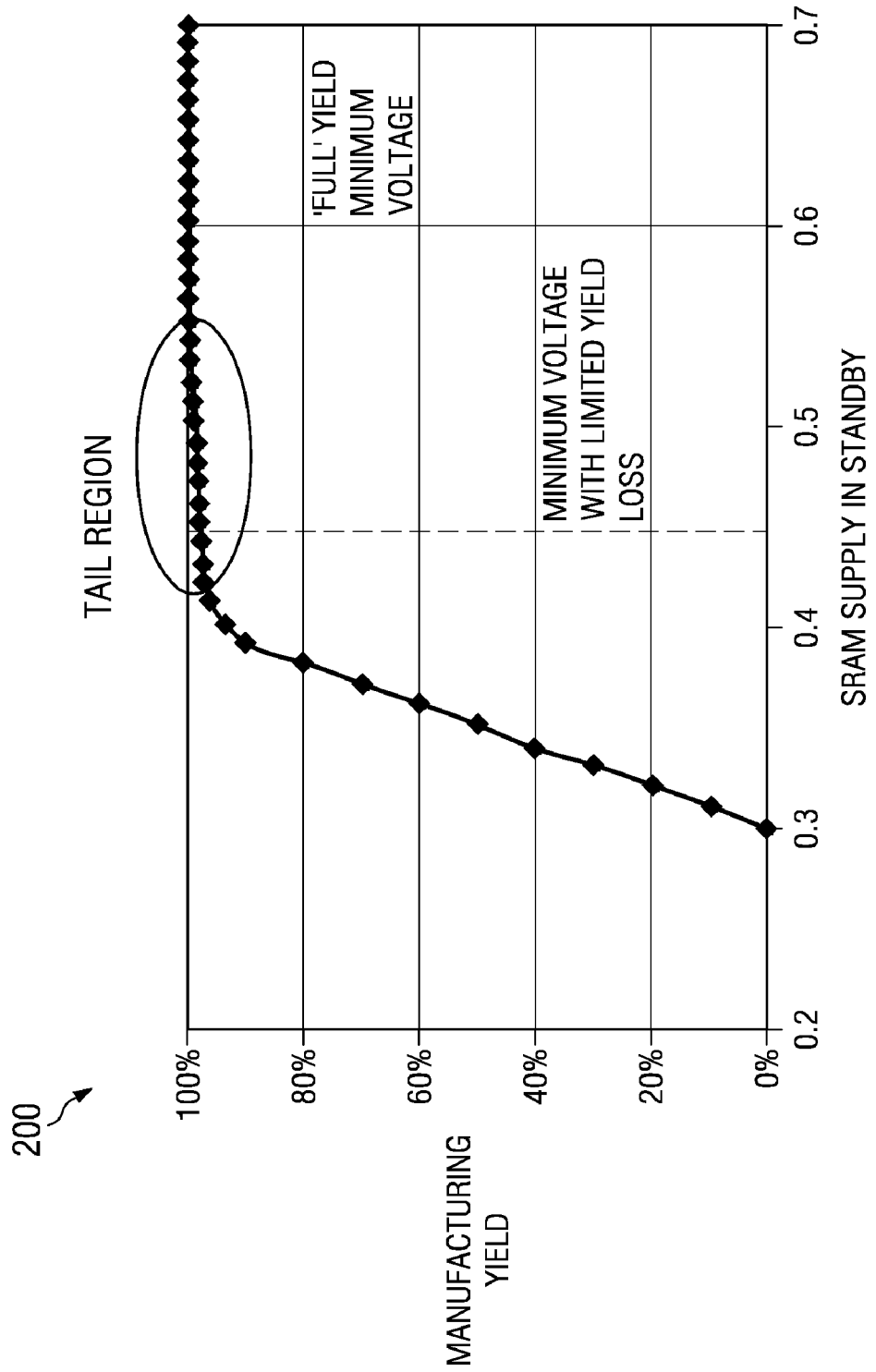
FIG. 6 illustrates a graph of manufacturing yield versus SRAM supply voltage in standby mode for ICs having 45 nm wide transistor gate circuits in accordance with an aspect of the invention.

In accordance with an aspect of the invention, the active operating voltage is derived from the positive supply voltage $V_{DDS}$ and the minimum memory retention voltage is derived from the peripheral supply voltage $V_{PER}$. In this manner, the peripheral supply voltage $V_{PER}$ can be set to provide a voltage to the one or more peripheral circuits 18 (e.g., about 0.7 volts to about 0.8 volts) that is at a minimum voltage that the peripheral circuit can reliably operate in both an active mode and a standby mode, and the peripheral supply voltage can be employed to derive the minimum memory retention voltage (e.g., about 0.5 volts to about 0.6 volts) in the standby mode. This provides for both a reduction in power consumption in both the one or more peripheral circuits 18 and the one or more memory arrays 16. It is to be appreciated that some memory arrays may operate reliably enough to retain logic states at a voltage below the minimum memory retention voltage (e.g., about 0.4 voltage to about 0.5 volts). This value can be stored on the integrated circuit 10 and employed to program the minimum memory retention voltage upon power up of the integrated circuit 10. FIG. 6 illustrates a graph 200 of manufacturing yield versus SRAM supply voltage in standby mode for ICs having 45 nm wide transistor gate circuits in accordance with an aspect of the invention. As illustrated in FIG. 6, a tail region illustrates memory arrays with high yields (e.g., greater than 97%) that operate at minimum memory retention voltages of about 0.4 voltage to about 0.5 volts.

In accordance with an aspect of the invention, a plurality of memory blocks of the one or more memory arrays 16 are each configured to be separately selectable between an active mode and a standby mode. This allows for a tri-state mode in which all of the memory blocks of the one or more memory arrays 16 can be in either the active mode or in the standby mode, or one or more of the memory blocks can be in the active mode and one or more of the memory blocks can be in the standby mode. In accordance with a further aspect of the invention, a selectably coupleable diode is disposed between a negative supply terminal of a respective memory block and a negative supply terminal of the positive supply voltage $V_{DDS}$ such that a first memory block can be configured to operate in the active mode with the diode shorted, while a second memory block can be configured to operate in the standby mode by selecting a respective diode causing the voltage on the negative supply terminal of the respective memory block to increase by a diode drop for a memory block in the standby mode. The selectably coupleable diodes can form part of the power management system 12 or the memory system 14.

It is to be understood that the memory system 10 is not intended to be limited to the example of FIG. 1. For example, one or more components of a typical memory IC have been omitted from the example of FIG. 1 for the sake of simplicity of explanation. As another example, the memory system 14 can be included in an application specific integrated circuit (ASIC), such that the memory system 14 can be interfaced with other integrated components, as well. Furthermore, for a memory system 14 having a plurality of memory arrays 16, the power management system 12 can provide the memory array supply voltage $V_{OUT}$ to each of the plurality of memory arrays or to a subset of the plurality of memory arrays 16, such that one or more of the memory arrays 16 can be provided with a supply voltage from another source. As another example, the memory system 14 can include a plurality of power management systems 12, such that each can independently regulate power for one or more memory arrays 16.

Figure 2:
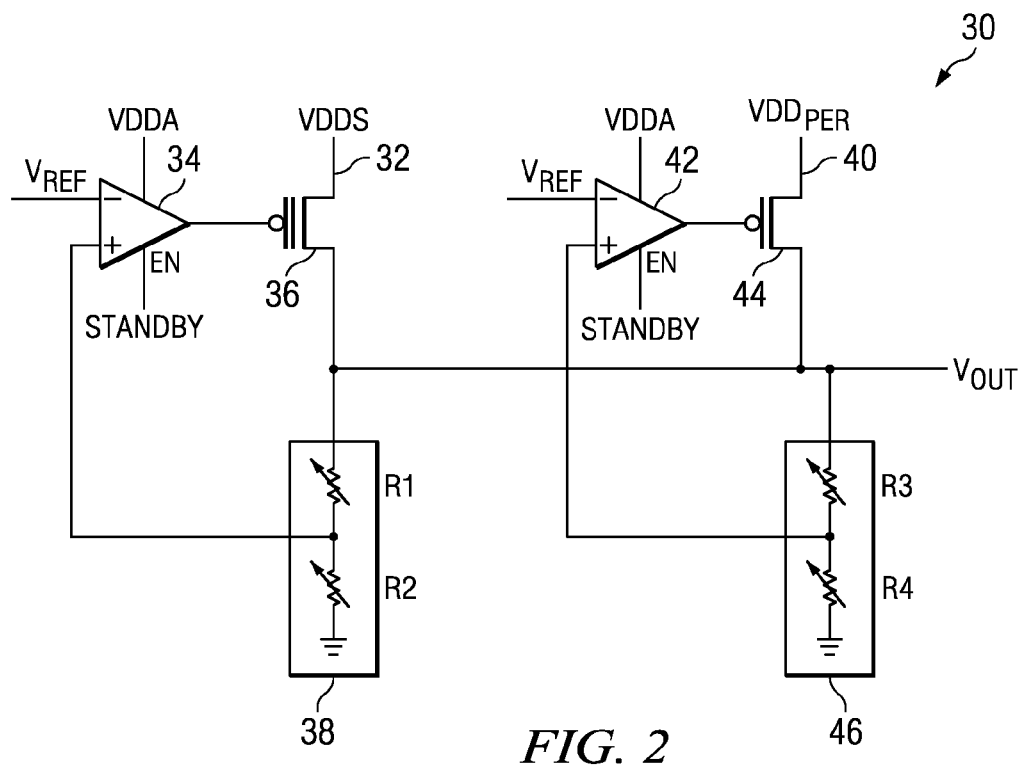
FIG. 2 illustrates an example of at least a portion of a power management system for a memory array in accordance with an aspect of the invention

FIG. 2 illustrates an example of at least a portion of a power management system 30 for a memory array in accordance with an aspect of the invention. The power management system 30 can provide an output voltage $V_{OUT}$ to one or more memory arrays, such as including the memory array 16 in the example of FIG. 1. The power management system 30 includes a first low dropout (LDO) regulator 32 that provides an output voltage at an active operating voltage and a second LDO regulator 40 that provides an output voltage at a minimum memory retention voltage. The outputs of the first and second LDO regulators 32 and 40 are coupled together and a logic state of a differential logic signal STANDBY and $\overline{\text{STANDBY}}$ controls, which of the LDO regulators are enabled and which of the LDO regulators are disabled. The differential logic signal can be derived from logic and/or control that is part of or separate from the power management system 30.

The first LDO regulator 32 includes a first differential error amplifier 34 coupled to a gate of a first power field effect transistor (FET) 36. The first differential error amplifier 34 receives a first input from a reference signal $V_{REF}$ provided from, for example, a band gap voltage, and receives a second input provided from a voltage divider 38 formed from a pair of resistors R1 and R2 coupled in series with a source of the first power FET 36. A drain of the first power FET 36 is coupled to a positive supply voltage $V_{DDS}$. The output voltage of the first LDO regulator 34 is determined by the drop out voltage of the first power FET 36, which is based on the reference voltage $V_{REF}$, the positive supply voltage $V_{DDS}$ and the ratio of the resistors R1 and R2. For example, as stated above, the reference voltage and the output voltage of the first LDO regulator 32 can be about 1.2 volts that is derived from a positive supply voltage of 1.8 volts, such that the dropout voltage is about 0.6 volts.

The second LDO regulator 40 includes a second differential error amplifier 42 coupled to gate of a second power FET 44. The second differential error amplifier 42 receives a first input from the reference signal and a second input signal provided from a voltage divider 46 formed from a pair of resistors R3 and R4 coupled in series with a source of the second power FET 44. A drain of the second power FET 44 is coupled to a peripheral voltage $V_{PER}$. The peripheral voltage $V_{PER}$ is also employed for powering at least one peripheral circuit for reading and/or writing to a memory array. The output voltage of the second LDO regulator 40 is determined by the drop out voltage of the second power FET 44, which is based on the reference voltage $V_{REF}$, the peripheral voltage $V_{PER}$ and the ratio of the resistors R3 and R4. For example, as stated above, the reference voltage can be 1.2 volts and the output voltage of the second LDO regulator 40 can be about 0.5 to about 0.6 volts that is derived from a peripheral voltage of about 0.7 to about 0.8 volts. Employment of the second LDO regulator 40 provides for the ability to provide a minimum memory retention voltage derived from a minimum peripheral operating voltage due to the ability to set the drop out voltage to about 0.2 volts. It is to be understood that the power management system 30 is not limited to the example of FIG. 2. For example, additional components and signal interfaces can be included in the power management system 30.

Figure 3:
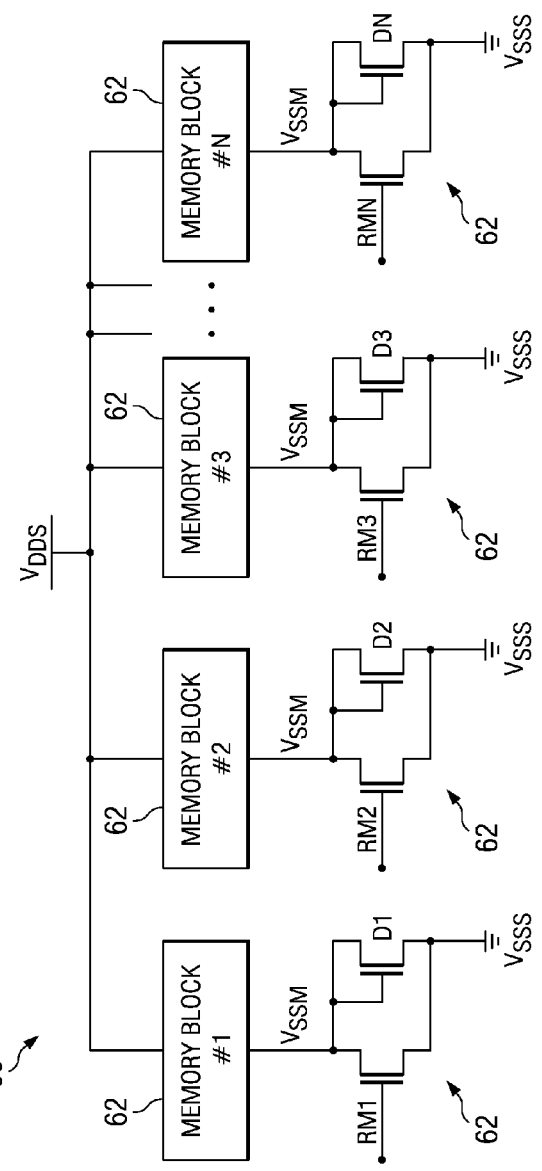
FIG. 3 illustrates a memory configuration that includes a plurality of memory blocks configured to operate in a tri-state mode in accordance with an aspect of the present invention.

FIG. 3 illustrates a memory configuration 60 that includes a plurality of memory blocks 62 configured to operate in a tri-state mode in accordance with an aspect of the present invention. Each of the plurality of memory blocks 62 labeled #1 through #N are configured to be separately selectable between an active mode and a standby mode, where N is an integer greater than two. This allows for a tri-state mode in which all of the memory blocks 62 of one or more memory arrays can be in either the active mode or in the standby mode, or one or more of the memory blocks 62 can be in the active mode and one or more of the memory blocks 62 can be in the standby mode. Each of the memory blocks 62 have a selectably coupleable diode 64 (labeled D1 through DN) disposed between a negative supply terminal $V_{SSM}$ of a respective memory block and a negative supply terminal $V_{SSS}$ of a positive supply voltage $V_{DDS}$ such that one or more memory blocks 62 can be configured to operate in the active mode with the diode shorted, while one or more of the memory block 62 can be configured to operate in the standby mode by selecting a respective diode 64 via a respective retention mode selection signal (RM1-RMN) causing the voltage on the negative supply terminal $V_{SSM}$ of the respective memory block to increase by a diode drop for a memory block in the standby mode. The selection signals can be provides via logic and control of the power management system or some other logic and control residing on an IC.

Figure 4:
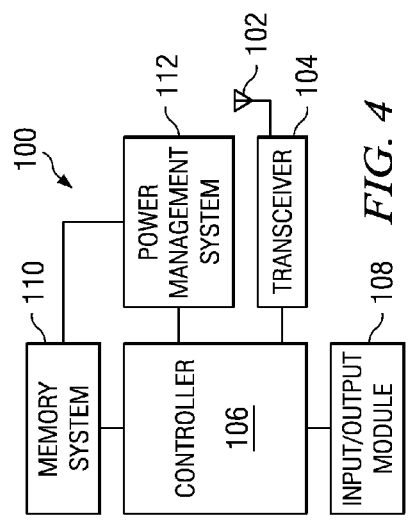
FIG. 4 illustrates a block diagram of a mobile communication device in accordance with an aspect of the invention.

FIG. 4 illustrates an example of a mobile communication device (MCD) 100, such as a cellular telephone that employs a power management system in accordance with an aspect of the present invention. Wireless signals are transmitted from and received at an antenna 102. The MCD 100 also includes a transceiver 104, a controller 106, and an input/output module 108, which could include a microphone and receiver. Wireless signals received at the antenna 102 are demodulated at the transceiver 104 and sent to the controller 106, such that the signals can be properly interpreted by the controller 106, such as voice data for a user of the MCD 100 at the input/output module 108. Similarly, user voice signals from the input/output module 108 can be sent to the transceiver 104 via the controller 106 to be modulated into a wireless signal that is transmitted from the antenna 102.

The MCD 100 also includes a memory system 110. The memory system could include both volatile and non-volatile memory. The non-volatile memory could include FLASH or other memory that stores information such as stored phone numbers and digital photographs. The volatile memory, which could include one or more memory circuits, could be used to store connection information, such as control information between the MCD 100 and a cell tower that is serving the MCD 100. Accordingly, as it is desirous to maintain high performance and to reduce circuitry overhead to maintain a smaller size of the MCD, the memory within the memory system 110 could include one or more power management systems 112 in accordance with an aspect of the invention.

For example, the memory system could include one or more memory arrays having selectably coupleable diodes disposed between a negative supply terminal of a respective memory block and a negative supply terminal of a positive supply voltage such that one or more memory blocks can be configured to operate in the active mode with the diode shorted, while one or more of the memory block can be configured to operate in the standby mode by selecting a respective diode causing the voltage on the negative supply terminal of the respective memory block to increase by a diode drop for a memory block in the standby mode.

At least one power management system 112 can be configured to provide an output voltage for powering the memory of the memory system 110 by an active operating voltage provided from a first LDO regulator and configured to provide an output voltage for powering the memory of the memory system 110 with a minimum memory retention voltage provided from a second LDO regulator. The minimum memory retention voltage can be derived from a minimum peripheral operating voltage of at least one peripheral circuit for reading and/or writing to the memory.

Figure 5:
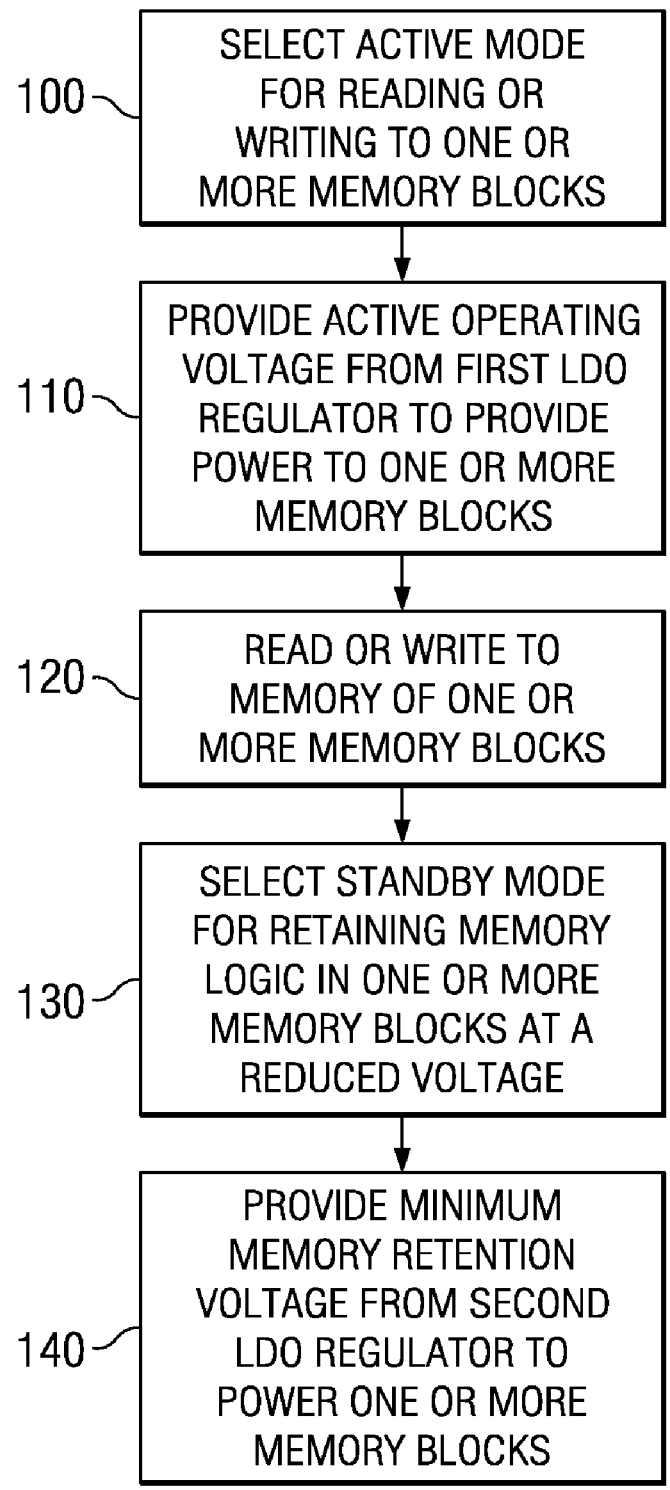
FIG. 5 illustrates a method for managing power for one or more memory blocks in accordance with an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method.

FIG. 5 illustrates a method for managing power for one or more memory blocks in accordance with an aspect of the invention. The method can be implemented in a memory system, such as an SRAM that is included in a mobile communication device. The method begins at 100 where an active mode is selected for reading or writing to one or more memory blocks. The memory can be configured in a tri-state mode, such that memory blocks are individually selectable (e.g., via a selectable diode of FIG. 3) between either operating in a standby mode or an active mode where memory blocks that are not being read from or written to can be powered at a minimum memory retention voltage. The minimum retention voltage can be set at the factory or read from memory and set during power up. At 110, an active operating voltage is provided from a first LDO regulator to provide power to the one or more memory blocks. At 120, logic states are read from or written to memory of the one or more memory blocks. At 130, standby mode is selected for retaining memory logic in the one or memory blocks at a reduced voltage. At 140, a minimum memory retention voltage is provided from a second LDO regulator to power the one or more memory blocks. The active operating voltage can be derived from a positive supply voltage and the minimum memory retention voltage can be derived from a peripheral supply voltage $V_{PER}$ for providing power to one or more peripheral circuits for reading and/or writing to the one or more memory blocks. In this manner, the peripheral supply voltage can be set to provide a voltage to one or more peripheral circuits that is at a minimum voltage that the peripheral circuit can reliably operate in both an active mode and a standby mode, and the peripheral circuit voltage can be employed to derive the minimum memory retention voltage in the standby mode.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A memory power management system comprising:
a first low dropout (LDO) regulator that provides an active operating voltage that is derived from a first supply voltage to power a memory array during an active mode; and
a second LDO regulator that provides a minimum memory retention voltage that is derived from a second supply voltage to power the memory array in a standby mode, wherein the second supply voltage also powers at least one peripheral circuit for reading from and/or writing to the memory array.

2. The system of claim 1, wherein an output of the first LDO and the second LDO are coupled together and the first LDO is enabled and the second LDO disabled in the active mode and the first LDO is disabled and the second LDO is enabled in the standby mode.

3. The system of claim 1, wherein the first supply voltage is greater than the second supply voltage.

4. The system of claim 3, wherein the first supply voltage has a voltage of about 1.8 volts and the second supply voltage has a voltage of about 0.7 to about 0.8 volts.

5. The system of claim 4, wherein the first LDO provides an output voltage of about 1.2 volts in the active mode and the second LDO provides an output voltage of about 0.5 volts to about 0.6 volts in the standby mode.

6. The system of claim 1, wherein second supply voltage is set to provide a voltage to the at least one peripheral circuit that is at a minimum voltage that the at least one peripheral voltage can operate and the second LDO is set to provide a dropout voltage from the second supply voltage that provides an output voltage that is substantially equal to the minimum memory retention voltage.

7. The system of claim 1, wherein the second LDO provides an output voltage of about 0.4 volts to about 0.5 volts based on a value stored in the system.

8. The system of claim 1, wherein the memory array comprises a plurality of memory blocks each being configured to be separately selectable between an active mode and a standby mode.

9. The system of claim 1, further comprising a selectably coupleable diode disposed between a negative supply terminal of the memory block and a negative supply terminal of the first voltage supply, such that a first memory block can be configured to operate in the active mode, while a second memory block can be configured to operate in the standby mode by selecting a respective diode causing the voltage on the negative supply terminal of the memory block to increase by a diode drop.

10. A mobile communication device comprising the system of claim 1, and further comprising a controller connected to the power management system and a memory, a transceiver, and an input/output module coupled to the controller.

11. An integrated circuit comprising the system of claim 1.

12. An integrated circuit (IC) comprising:
a memory system comprising:
a memory array; and
one or more peripheral circuits for reading and/or writing to the memory array; and
a power management system comprising:
a first low dropout (LDO) regulator that provides an active operating voltage that is derived from a first supply voltage to power the memory array during an active mode; and
a second LDO regulator that provides a minimum memory retention voltage that is derived from a second supply voltage to power the memory array in a standby mode, wherein the second supply voltage is at a minimum peripheral voltage for powering the one or more peripheral circuits for reading and/or writing to the memory array.

13. The IC of claim 12, wherein an output of the first LDO and the second LDO are coupled together and the first LDO is enabled and the second LDO disabled in the active mode and the first LDO is disabled and the second LDO is enabled in the standby mode.

14. The IC of claim 12, further comprising a respective selectably coupleable diode disposed between a negative supply terminal of each memory block of the memory array and a negative supply terminal of the first voltage supply, such that a first memory block can be configured to operate in the active mode, while a second memory block can be configured to operate in the standby mode by selecting a respective diode causing the voltage on the negative supply terminal of the respective memory block to increase by a diode drop.

15. A mobile communication device comprising the IC of claim 12, and further comprising a controller connected to the power management system and the memory and a transceiver, and an input/output module coupled to the controller.

* * * * *